United States Patent [19]
Morrison et al.

[11] Patent Number: 5,166,865
[45] Date of Patent: Nov. 24, 1992

[54] COMPLIANCY TOLERANT PATTERN FOR CIRCUIT CARRYING SUBSTRATE

[75] Inventors: Andrew T. Morrison, Bedford; Aaron B. Mullins, Hurst, both of Tex.

[73] Assignee: Motorola, Inc., Shaumburg, Ill.

[21] Appl. No.: 768,470

[22] Filed: Sep. 30, 1991

Related U.S. Application Data

[63] Continuation of Ser. No. 561,407, Jul. 30, 1990.

[51] Int. Cl.$^5$ .............................................. H05K 7/02
[52] U.S. Cl. ..................... 361/400; 174/260; 361/411; 439/67; 439/458
[58] Field of Search ............... 174/250, 260, 262, 263, 174/265; 361/380, 381, 383, 386, 388, 389, 397, 400, 403, 406, 409; 439/67, 449, 457, 458; 357/80

[56] References Cited

U.S. PATENT DOCUMENTS

H921    5/1991  Wannemacher, Jr. .............. 361/400
4,930,045  5/1990  Carlson et al. ...................... 361/383
5,045,666  9/1991  Kent ................................. 219/85.22

FOREIGN PATENT DOCUMENTS 0225191  9/1989  Japan ..................................... 439/67

Primary Examiner—Leo P. Picard
Assistant Examiner—D. Sparks
Attorney, Agent, or Firm—M. Mansour Ghomeshi

[57] ABSTRACT

A circuit carrying substrate (108) accommodates circuit components (102) with different coefficients of expansion and contraction from that of the circuit carrying substrate (108). Beneath the components (102) a plurality of slots (104) are formed so as to minimize the effects of the differing coefficients of expansion and contraction.

9 Claims, 4 Drawing Sheets

COMPLIANCY TOLERANT PATTERN FOR CIRCUIT CARRYING SUBSTRATE

This is a continuation of application Ser. No. 07/561,407, filed Jul. 30, 1990, and now abandoned.

TECHNICAL FIELD

This invention relates generally to communication devices, and more specifically to circuit carrying substrates for such devices, and is particularly directed toward circuit carrying substrates used with circuit components having a thermal coefficient of expansion and contraction (TCE) different than that of the circuit carrying substrate.

BACKGROUND

It is known that the mechanical coupling of certain circuit components to various substrates or printed circuit boards is hampered by the differing TCE of such materials. Such coefficient differentials often result in component breakage or cracks in the adhesive agents (e.g., solder), which results in contact intermittences.

In the past, various methods have been employed to minimize the effects of such incompatibilities. For example some manufacturers employ customized brackets to attach certain components to the printed circuit boards. However, the increased material cost, special handling, and the maintenance of additional inventory have rendered such approaches less desirable. In many cases, additional compensation circuitry must be added to the design to compensate for changes in electrical performance due to the brackets. This has resulted in higher product and development costs and additional inventory.

Accordingly, a need exists for a printed circuit board pattern capable of reducing the detrimental effects of the TCE incompatibilities between circuit components and the substrates carrying them.

SUMMARY OF THE INVENTION

Briefly, according to the invention, a communication device comprising a transceiver circuitry for receiving and transmitting radio frequency signals includes a circuit carrying substrate. The substrate has a plurality of apertures of equal or differing widths and lengths disposed directly beneath certain circuit component(s).

DETAILED DESCRIPTION OF THE PREFERRED EMBODIMENT

Figure 1:
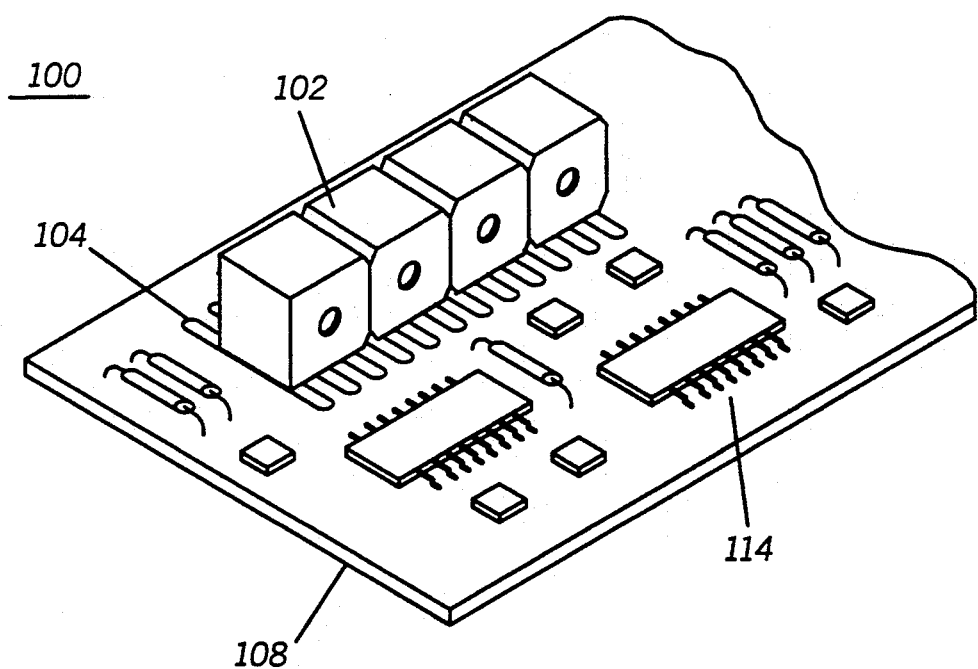
FIG. 1 is a perspective illustration of a populated circuit carrying substrate in accordance with the present invention.

Referring to FIG. 1, there is shown a circuit carrying substrate (printed circuit board) 108 in accordance with the present invention. The printed circuit board 108 includes a plurality of apertures 104 disposed thereon. The illustrated printed circuit board 108 accommodates at least a portion of transceiver circuitry such as components 102, 110, 112, and 114 that are coupled to the printed circuit board 108 via an adhesive agent such as solder.

In accordance with the present invention circuit component(s) (e.g., a filter(s)) 102 is coupled to the printed circuit board 108 over the plurality of apertures 104. The circuit component(s) 102 may be an aggregate of components assembled on any substrate such as ceramic with a different thermal coefficient of expansion and contraction than that of the printed circuit board 108. The circuit component(s) 102 may be coupled to the printed circuit board 108 via one or several known and inclusive surface mount or pin connections.

The plurality of apertures 104 form a structure that will accommodate some degree of thermal expansion and contraction, thereby allowing two different materials having differing thermal characteristics expand and contract without component breakage or cracks in the adhesive agent (e.g., solder).

Figure 3:
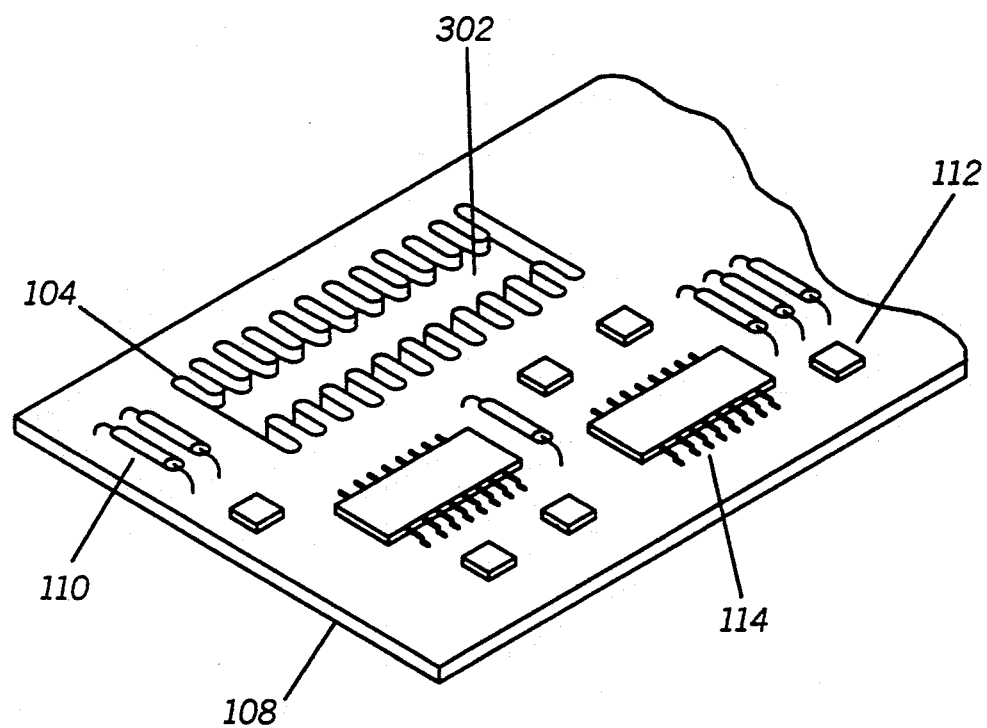
FIG. 3 is a derivative of FIG. 1 illustrating more details of the invention.

Referring to FIG. 3, the printed circuit board 100 of FIG. 1 is shown with the filter 102 removed for clarity of plurality of apertures 104 in accordance with the present invention. Preferably the plurality of apertures blend into each other leaving some or all the area on the printed circuit board 108 beneath the filter 102 void 302. Said void 302 would absorb some of the expansion or contraction of the printed circuit board 108 locally and stops it from multiplying and moving to the sides, thereby relieving the strain from the filter 102 which does not expand or contract equally.

Optionally the plurality of apertures 104 may be aligned so as to produce any angle(s) with the circuit component(s) 102 and be of equal or differing lengths and/or widths. Said plurality of apertures 104 may protrude beyond the boundaries of one or all sides of the circuit component(s) 102 thereon. Furthermore, the plurality of apertures 104 may be variably spaced from each other and cover all or part of the circuit component(s) 102 as required by the design known to people skilled in the art.

Figure 4:
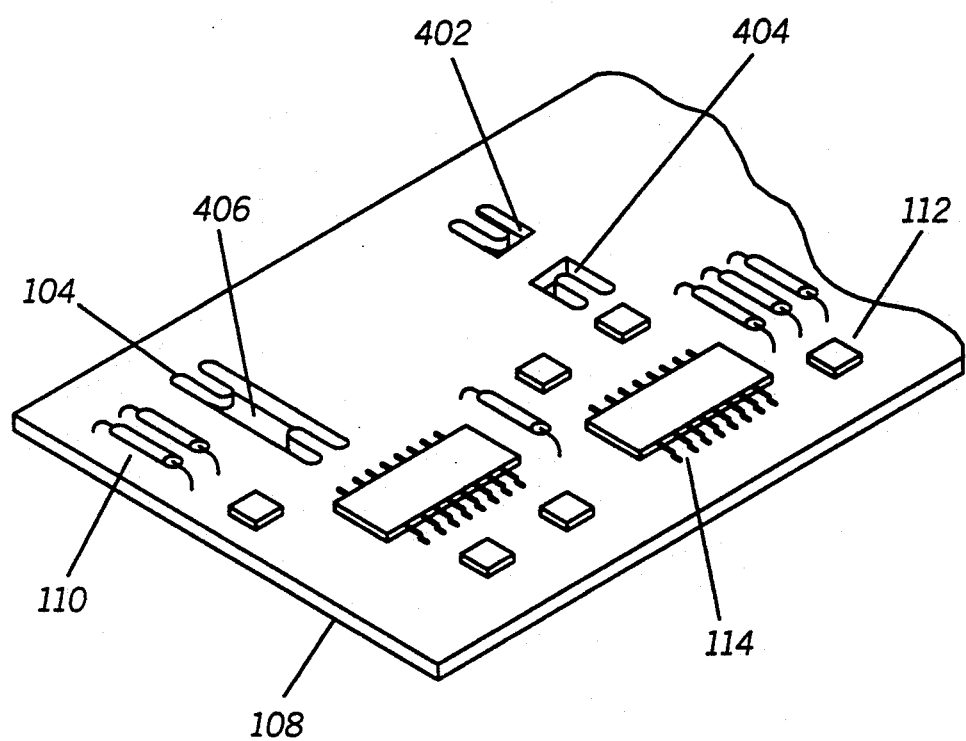
FIG. 4 is an illustration of a circuit carrying substrate illustrating an optional embodiment of the present invention.

Referring now to FIG. 4, the printed circuit board 100 of FIG. 1 is shown with the filter 102 removed for clarity of an optional embodiment of plurality of apertures 402, 404, and 406. Said plurality of apertures 402, 404, and 406 form H or U shapes with fingers protruding the openings of such shapes to provide coupling of the filter 102 to the printed circuit board 108. Said plurality of apertures 402, 404, and 406 may be repeated for additional electrical coupling and mechanical decoupling of the filter 102 to the printed circuit board 108.

Figure 2:
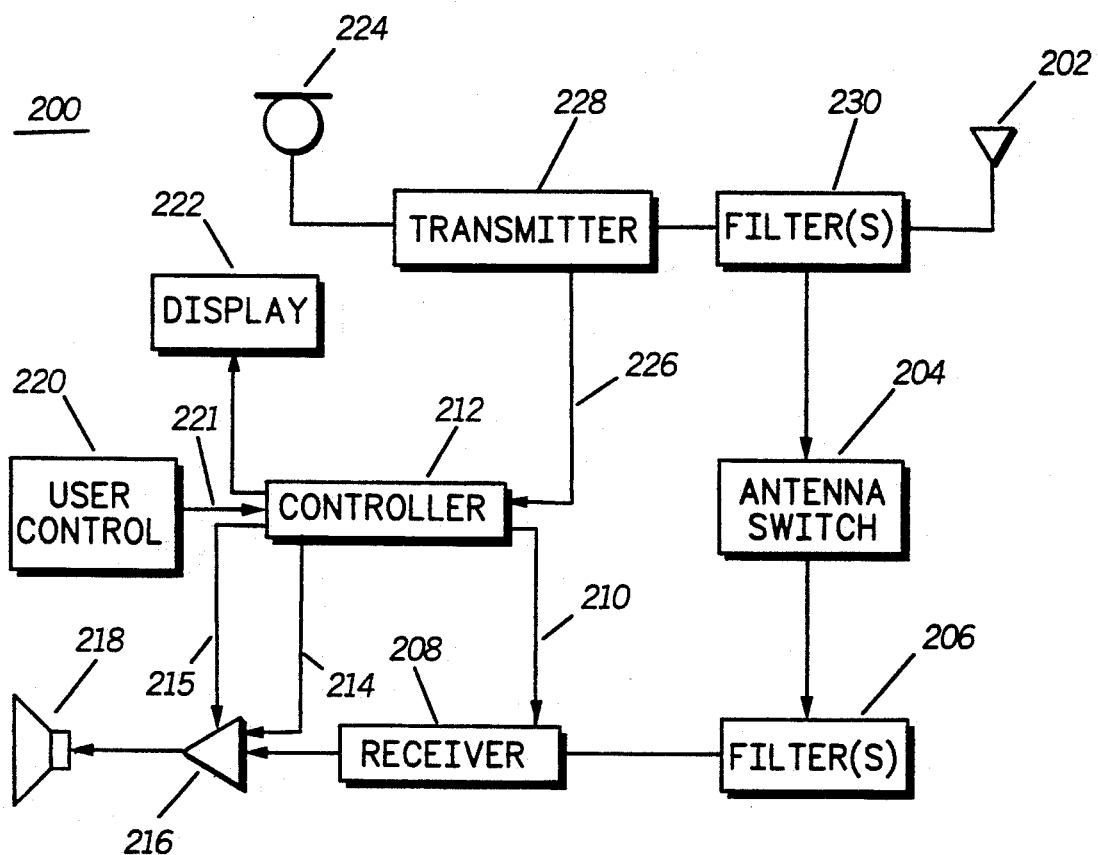
FIG. 2 is a block diagram of a communication device in accordance with the present invention.

Referring to FIG. 2, a radio communication device 200 in accordance with the present invention includes an antenna switch 204 that can selectively couple the antenna 202 to either a receiver 208 via filter(s) 206 or a transmitter 228 via filter(s) 230.

To receive a message, a radio frequency signal is routed from an antenna 202 to a receiver 208 via the antenna switch 204 and a filter(s) 206. The receiver 208 may be of conventional design. The receiver 208 provides data messages to the controller 212 via data line 210. Typically, the controller 212 operates to alert the radio user and present a received message in a variety of ways depending upon the message type and optional features that may be enabled or disabled by the radio user. Thus the controller 212 may send an alert signal to an amplifier 216, via data line 214, to be presented to the radio operator via the speaker 218. After the alert, a voice message may be provided by the receiver 208 to the amplifier 216 for presentation via the speaker 218. Data messages would follow the radio's address code to the controller 212 via data line 210. Such messages are subsequently analyzed by the controller 210 and if appropriate sent to a display 222 for presentation.

To transmit a signal, a voice message is routed from the microphone 224 to the transmitter 228 for transmission via the antenna 202 through filter(s) 230 and antenna switch 204. Data messages are processed by the controller 212 and are subsequently presented to the transmitter 228 for transmission via the antenna 202 through filter(s) 230 and antenna switch 204.

We claim:

1. A substrate assembly, comprising:
   a circuit carrying substrate, having a coefficient of expansion and contraction and a plurality of apertures; and
   a component having a different coefficient of expansion and contraction disposed on said substrate spanning at least some of said apertures and coupled to said substrate via an adhesive agent, the apertures allowing the substrate and the component to expand at different rates without damaging the integrity of the adhesive agent.

2. The substrate assembly of claim 1, wherein said circuit component comprises a ceramic based component.

3. The substrate assembly of claim 2, wherein said ceramic based circuit component comprises a filter(s).

4. The substrate of claim 1, wherein said adhesive agent comprises solder.

5. A communication device, comprising:
   radio circuitry for receiving and transmitting radio frequency signals and including a plurality of circuit components having a first coefficient of expansion and contraction; and
   at least one circuit carrying substrate having a coefficient of expansion and contraction different from the first coefficient, the substrate constructed and arranged to carry at least a portion of the transceiver circuitry, the circuit carrying substrate having at least one or a plurality of slots disposed beneath at least one of said plurality of circuit components for partially absorbing the expansion and contraction difference relieving the stress on the substrate, the component and their junction.

6. The communication device of claim 5, wherein said at least one component comprises a ceramic based circuit component.

7. The communication device of claim 6, wherein said ceramic based circuit component comprises a filter(s).

8. The substrate of claim 5, wherein said adhesive agent comprises solder.

9. A substrate assembly, comprising:
   a circuit carrying substrate, having a first coefficient of expansion and contraction and a plurality of apertures; and
   a component having a second coefficient of expansion and contraction different from the first coefficient, and solder connected to said substrate over at least some of said apertures, the apertures adapted below the component for allowing the substrate and the component to expand and contract at different rates without damaging the solder connection.

* * * * *